(12) United States Patent
Shiu et al.

(10) Patent No.: US 7,429,945 B2
(45) Date of Patent: Sep. 30, 2008

(54) ANALOG TO DIGITAL CONVERTER

(75) Inventors: Shian-Sung Shiu, Taipei (TW);
Kuo-Wei Peng, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 0 days.

(21) Appl. No.: 11/622,045

(22) Filed: Jan. 11, 2007

(65) Prior Publication Data

US 2007/0252742 A1 Nov. 1, 2007

(30) Foreign Application Priority Data

Apr. 27, 2006 (TW) .............. 95115039 A

(51) Int. Cl.
*H03M 1/14* (2006.01)
(52) U.S. Cl. ................................... 341/156
(58) Field of Classification Search ........... 341/156
See application file for complete search history.

(56) References Cited

U.S. PATENT DOCUMENTS 4,639,715 A * 1/1987 Doluca ................ 341/120
4,903,028 A * 2/1990 Fukushima ........... 341/156
5,463,395 A * 10/1995 Sawai ................... 341/156
2004/0189504 A1* 9/2004 Dasgupta .............. 341/156

OTHER PUBLICATIONS

Shih et al., A Fully Differential Comparator Using a Switched-Capacitor Differencing Circuit with Common-Mode Rejection, IEEE Journal of Solid-State Circuits, vol. 32, No. 2, Feb. 1997 pp. 250-253.*

* cited by examiner

*Primary Examiner*—Howard Williams
(74) *Attorney, Agent, or Firm*—Thomas, Kayden, Horstemeyer & Risley

(57) ABSTRACT

The invention relates to an analog-to-digital converter comprising a reference voltage generating circuit, two coarse/fine comparators and two encoders for encoding the comparison result of the two coarse/fine comparators. In the invention, the two coarse/fine comparators processes a coarse comparison procedure and a fine comparison procedure on an input voltage in different clock cycle, thus, a sampling voltage error caused by an error of sampling time decreases. In another aspect of the invention, the capacitance of the input capacitor of the analog-to-digital converter decreases because the comparators for coarse comparison and fine comparison are the same, thus, a large power amplifier is not required for driving the input capacitor.

31 Claims, 14 Drawing Sheets

ANALOG TO DIGITAL CONVERTER

BACKGROUND OF THE INVENTION

1. Field of the Invention

The invention relates to an analog to digital converter, and more particularly to an analog to digital converter reducing the effects of charge injection, clock feedthrough and voltage sampling errors.

2. Description of the Related Art

FIG. 1 is a block diagram of a conventional (N+M)-bit analog to digital converter. A reference voltage generating circuit 12 generates a plurality of first reference voltages 102 and a plurality of second reference voltages 101 between the voltages $V_{RT}$ and $V_{RB}$. A most significant bit (MSB) comparator 15 receives and compares the first reference voltage 102 with the input voltage Vin. Two least most significant (LSB) comparators 11 and 13 receive and compare the second reference voltage 101 with the input voltage Vin. The reference voltage generating circuit 12 generates ($2^N-1$) first reference voltages 102 between voltage $V_{RT}$ and $V_{RB}$, and then generates ($2^M-1$) second reference voltages 101 between two adjacent first reference voltages.

After the input voltage Vin is compared by the MSB comparator 15, a first thermometer code 105 is generated and transmitted to an MSB data encoder 17 to acquire N-bit digital code 108. The digital code 108 is transmitted and temporarily stored in MSB data latch 18.

When the input voltage Vin has been compared by the MSB comparator 15 based on the first reference voltages 102, it can be determined where in the range between the two first reference voltages the input voltage falls. The input voltage Vin is then compared with the second reference voltages by LSB comparators 11 and 13 to generate second thermometer codes 103 and 104. LSB data encoder 14 generates and transmits an M-bit digital code 106 to LSB data selector and latch 19 based on the second thermometer code 103. A LSB data encoder 16 generates and transmits an M-bit digital code 107 to LSB data selector and latch 19 based on the second thermometer code 104.

Because the N-bit digital code generated by MSB data encoder 17 is one clock cycle faster than the M-bit digital code generated by LSB encoder 14 or 16, the MSB data latch 18 transmits the N-bit digital code to the adder 19 after a delay of one clock cycle to combine with the M-bit digital code to acquire an (N+M)-bit digital data of the input voltage Vin.

If the frequency of the MSB comparator 15 is Fs, the frequency of LSB comparators 11 and 13 is ½FS. Since the sampling circuits for MSB comparator 15, and LSB comparators 11 and 13 are different, a sampling error is generated. This causes the voltage sampled by the MSB comparator 15, LSB comparators 11 and 13 to be different, thus, the accuracy of analog-to-digital conversion suffers.

Moreover, the MSB comparator 15, LSB comparators 11 and 13, employ single-ended amplifiers which easily generate charge injection and clock feedthrough when the switches of the comparators are switched.

BRIEF SUMMARY OF THE INVENTION

Analog to digital converters capable of reducing voltage sampling errors and the effects of charge injection and the clock feedthrough due to switching of the comparator switch are provided.

Layout methods for optimizing the layout of analog to digital converters are provided.

An exemplary embodiment of an analog to digital converter comprising a reference voltage generating circuit and a first comparator is provided. The reference voltage generating circuit generates a plurality of first reference voltages and a plurality of second of reference voltages based on a first control signal. The first comparator receives the first reference voltages and stores a first input signal, and based on the first reference voltages and the first input signal to generate a first comparison code and a first control signal at a first period. The first comparator further receives the second reference voltages, and generates a second comparison code at a second period based on the second reference voltages and the first input signal.

An exemplary embodiment of a comparator comprising a voltage storage element, an amplifier and a comparison unit is provided. The voltage storage element has a first voltage storage unit and a second voltage storage unit to store voltage, wherein the stored voltage of the voltage storage element is determined based on the voltage of the input signal of the voltage storage element. The amplifier has a first input terminal coupled to one terminal of the first voltage storage unit and a second input terminal coupled to one terminal of the second voltage storage unit to output at least one differential signal based on the stored voltages of the first voltage storage unit and the second voltage storage unit. The comparison element is coupled to the amplifier to output a comparison signal based on the differential signal. At the first period, the first voltage storage unit receives an input signal and stores a first voltage, the second voltage storage units receives a first reference voltage and stores a second voltage, the amplifier outputs a first differential signal based on the first voltage and the second voltage. At the second period, the first voltage storage unit is further coupled to a second reference voltage, the second voltage storage unit is further coupled to the first reference voltage, and herewith the amplifier outputs a second differential signal based on the stored voltages of the first voltage storage unit and the second voltage storage unit.

An exemplary embodiment of a layout method for an analog to digital converter comprises providing a substrate; disposing a reference voltage generating circuit on the substrate; disposing a first coarse/fine comparator on a first side of the reference voltage generating circuit, and a second coarse/fine comparator on a second side, wherein the second side is the opposite side of the first side; disposing a first encoder on the same side of the first coarse/fine comparator and a second encoder on the same side of the second coarse/fine comparator.

Another exemplary embodiment of an analog to digital converter comprising a reference voltage generating circuit, a first comparator and a second comparator is provided. The reference voltage generating circuit generates a first reference voltage. The first comparator receives and compares an input voltage and the first reference voltage to output a first control signal and a first code, wherein the reference voltage generating circuit outputs a second reference voltage in response to the first control signal, and the first comparator compares the input voltage and the second reference voltage to output a second code. The second comparator receiving and comparing the input voltage and the first reference voltage to output a second control signal and a third code, wherein the reference voltage generating circuit outputs a third reference voltage in response to the second control signal, and the second comparator compares the input voltage and the third reference voltage to output a fourth code.

Another exemplary embodiment of an analog to digital converter comprising a reference voltage generating circuit, a first comparator and a second comparator. The reference voltage generating circuit generates a first reference voltage. The first comparator receives and compares a first input voltage and the first reference voltage to output a first control signal and a first code, wherein the reference voltage generating circuit outputs a second reference voltage in response to the first control signal, and the first comparator compares the first input voltage and the second reference voltage to output a second code. The second comparator receives and compares a second input voltage and the first reference voltage to output a second control signal and a third code, wherein the reference voltage generating circuit outputs a third reference voltage in response to the second control signal and the second comparator compares the second input voltage and the third reference voltage to output a fourth code.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles and should not be taken in a limiting sense. The scope is best determined by reference to the appended claims.

Figure 1:
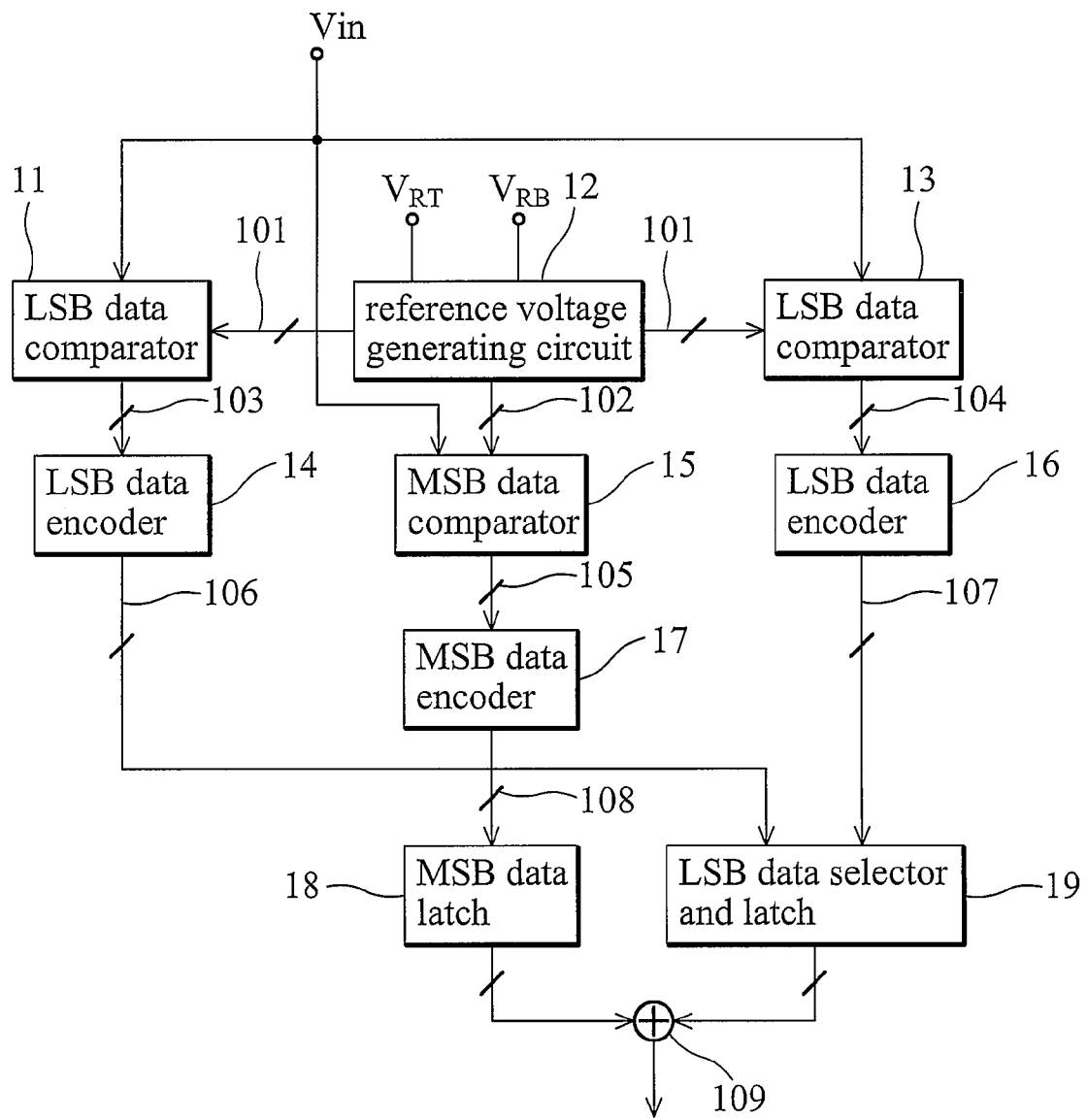
FIG. 1 is a block diagram of a conventional (N+M)-bit analog to digital converter.
Figure 2:
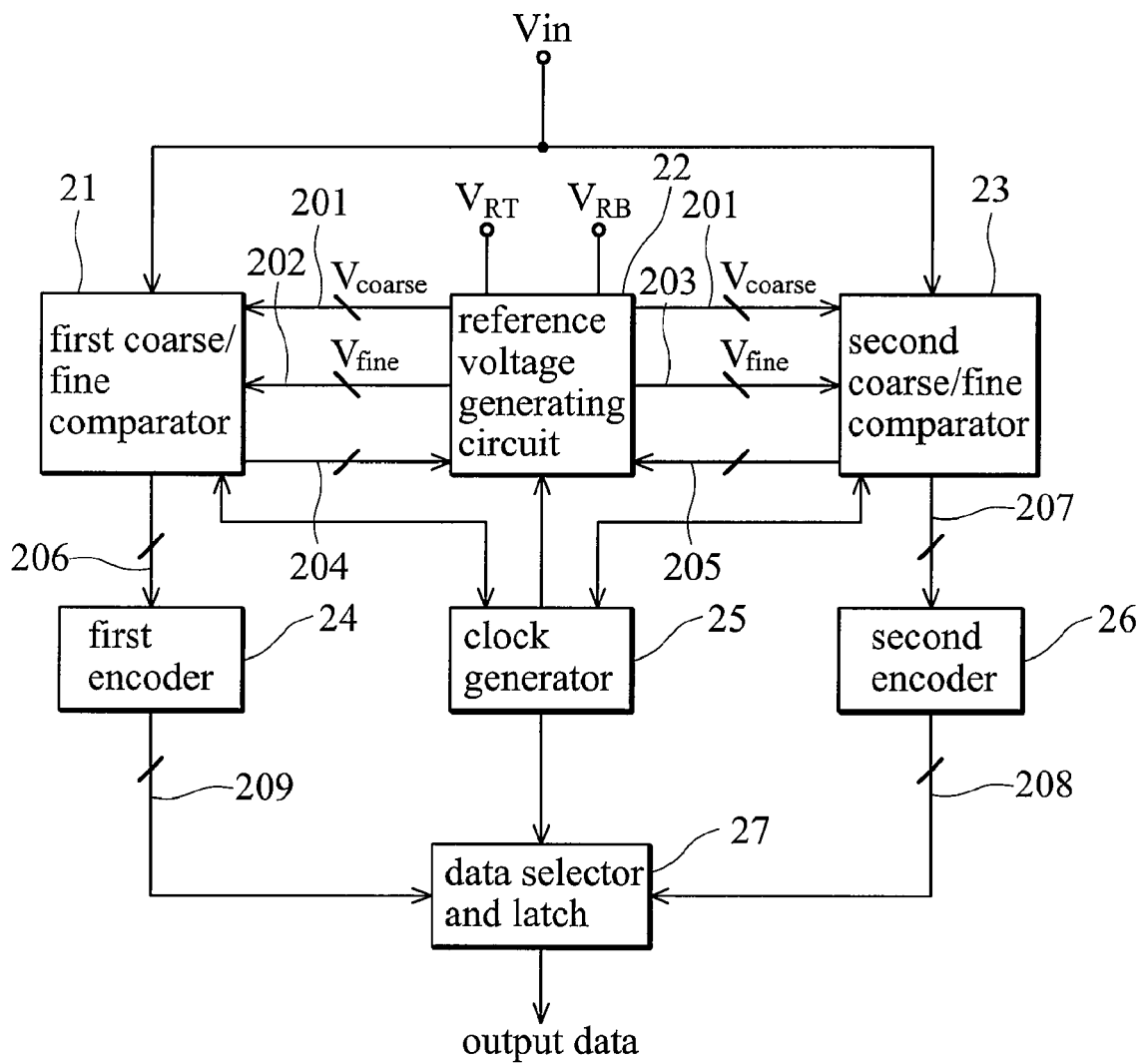
FIG. 2 is a block diagram of an embodiment of analog-to-digital converter.

FIG. 2 is a block diagram of an embodiment of an analog-to-digital converter. A reference voltage generating circuit 22 coupled to a first coarse/fine comparator 21 and a second coarse/fine comparator 23 generates reference voltages to the first coarse/fine comparator 21 and the second coarse/fine comparator 23 for comparing the input voltage Vin. A first encoder 24 coupled to the first coarse/fine comparator 21 transforms a thermometer code 206 from the first coarse/fine comparator 21 to a digital code 209. A second encoder 26 coupled to the second coarse/fine comparator 23 transforms a thermometer code 207 from the second coarse/fine comparator 23 to a digital code 208. A data selector and latch 27 receives and alternatively outputs the digital code 208 and 209.

A clock generator 25 provides a clock signal to the elements of the analog-to-digital converter. The reference voltage generating circuit 22 generates and transmits a plurality of coarse reference voltage $V_{COARSE}$ 201 to the first coarse/fine comparator 21 and the second coarse/fine comparator 23 based on the reference voltages $V_{RT}$ and $V_{RB}$.

The first coarse/fine comparator 21 and the second coarse/fine comparator 23 determines that the input voltage Vin lies between which two coarse reference voltage and outputs control signals 204 and 205 to the reference voltage generating circuit 22. The reference voltage generating circuit 22 outputs the corresponding fine reference voltages $V_{FINE}$ 202 to the first coarse/fine comparator 21 and the fine reference voltages $V_{FINE}$ 203 to the second coarse/fine comparator 23 for comparison with the input voltage Vin. After comparison, the first coarse/fine comparator 21 and the second coarse/fine comparator 23 output a first thermometer code 206 and a second thermometer code 207 respectively to a first encoder 24 and a second encoder 26 to encode the thermometer code.

Figure 3:
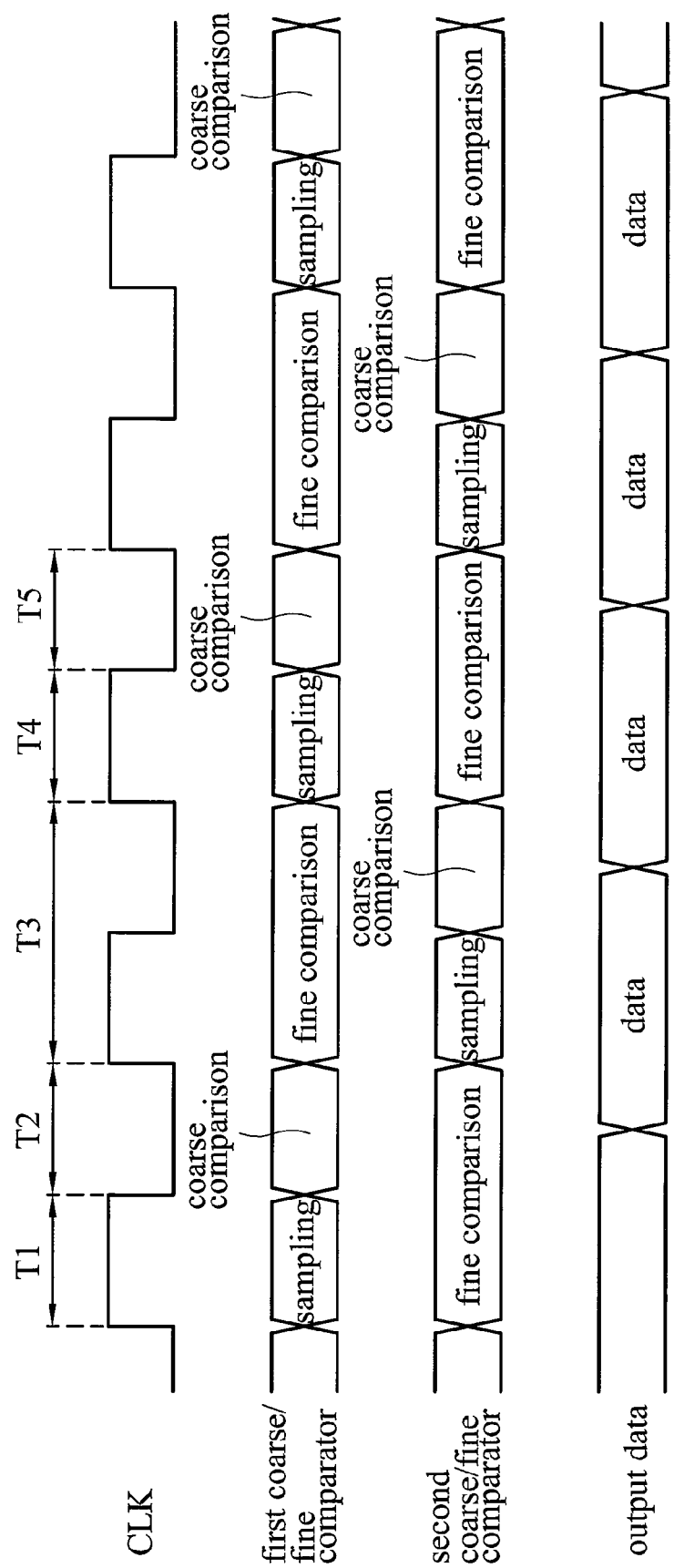
FIG. 3 is a timing diagram of the converter of FIG. 2.

FIG. 3 is a timing diagram of the converter of FIG. 2. At T1, the first coarse/fine comparator 21 acquires a first voltage by sampling the input voltage Vin. At T2, the first coarse/fine comparator 21 processes a coarse comparison on the first voltage. At T3, the first coarse/fine comparator 21 processes a fine comparison on the first voltage.

When the clock signal is high in T3, the second coarse/fine comparator 23 acquires a second voltage by sampling the input voltage Vin. When the clock signal is low in T3, the second coarse/fine comparator 23 processes a coarse comparison on the second voltage. At T4 and T5, the second coarse/fine comparator 23 processes a fine comparison on the second voltage.

After the comparison of the first voltage, the first thermometer code 206 is transmitted to the first encoder 24 to encode. After the comparison of the second voltage, the second thermometer code 207 is transmitted to the second encoder 26 to encode. The data selector and latch 27 receives and alternatively outputs the digital code 209 generated by the first encoder 24 and the digital code 208 generated by the second encoder 26.

Figure 4:
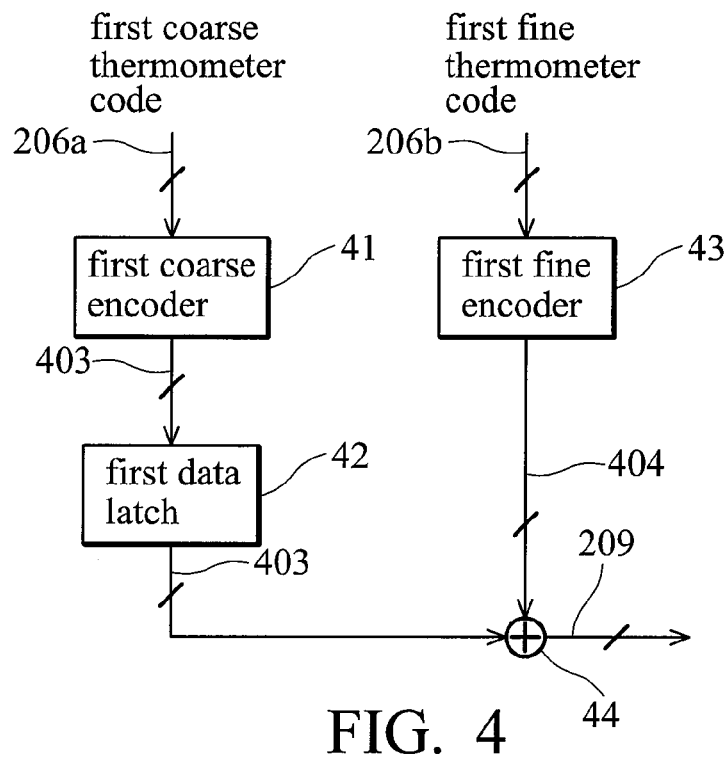
FIG. 4 is a block diagram of an embodiment of the first encoder 24 of FIG. 2.

FIG. 4 is a block diagram of an embodiment of the first encoder 24 of FIG. 2. The first encoder 24 comprising a first coarse encoder 41, a first fine encoder 43, a first data latch 42 and an adder 44. When a coarse comparison for the input voltage Vin is finished, a first coarse thermometer code 206a is generated and transmitted to the first coarse encoder 41 to generate a most significant bit (MSB) data 403. When a fine comparison for the input voltage Vin is finished, a first fine thermometer code 206b is generated and transmitted to the first fine encoder 43 to generate a least significant bit (LSB) data 404. The MSB data 403 is transmitted to the first data latch 42 for delaying one clock cycle. The adder 44 generates a digital code 209 based on the first LSB data 404 and the first MSB data 403 from the first data latch 42.

Figure 5:
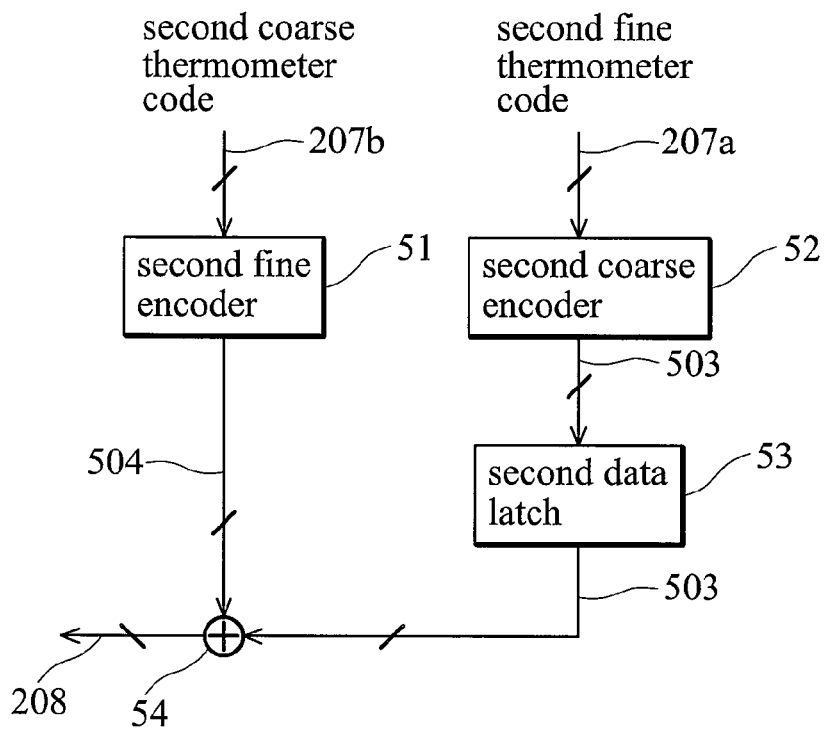
FIG. 5 is a block diagram of an embodiment of the second encoder 26 of FIG. 2.

FIG. 5 is a block diagram of an embodiment of the second encoder 26 of FIG. 2. The second encoder 26 comprising a second coarse encoder 52, a second fine encoder 51, a second data latch 53 and an adder 54. When a coarse comparison for the input voltage Vin is finished, a second coarse thermometer code 207a is generated and transmitted to the second coarse encoder 52 to generate MSB data 503. When a fine comparison for the input voltage Vin is finished, a second fine thermometer code 207b is generated and transmitted to the second fine encoder 51 to generate a LSB data 504. The MSB data 503 is transmitted to the second data latch 53 for delaying one clock cycle. The adder 54 generates a digital code 208 based on the second LSB data 504 and the second MSB data 503 from the second data latch 53.

Figure 6:
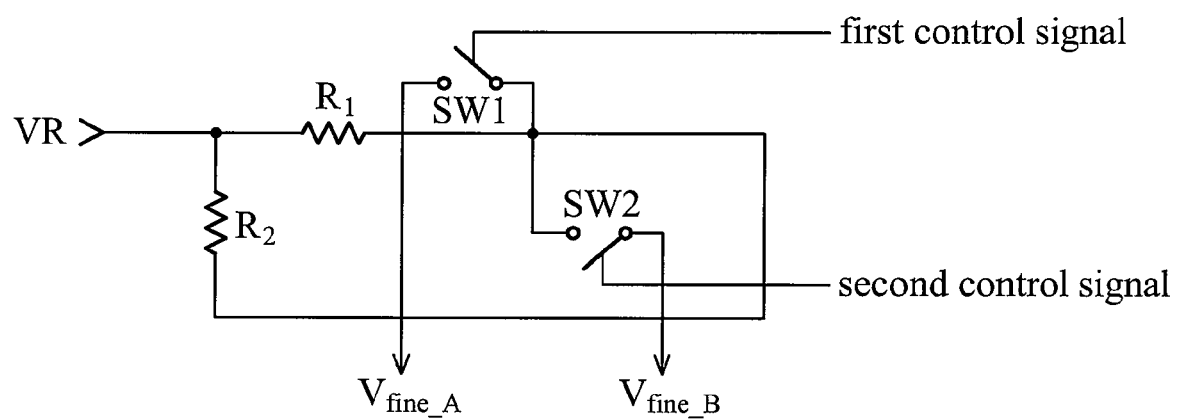
FIG. 6 is a circuit diagram of a reference voltage generating unit of the reference voltage generating circuit 22 in FIG. 2.

FIG. 6 is a circuit diagram of a reference voltage generating unit of the reference voltage generating circuit 22 in FIG. 2. The first switch SW1 controlled by the first control signal has a first terminal and a second terminal; when the first switch SW1 is turned on, the second terminal of the first switch SW1 outputs the fine reference voltage $V_{fine\_A}$. The second switch SW2 controlled by the second control signal has a first terminal and a second terminal; when the second switch SW2 is turned on, the second terminal of the second switch SW2 outputs the fine reference voltage $V_{fine\_B}$. The first resistor R1 has a first terminal and a second terminal; the first terminal of first the resistor is coupled to the first terminals of both the first switch SW1 and second switch SW2. The second resistor R2 has a first terminal and a second terminal; the first terminal of the second resistor R2 is coupled to the second terminal of the first resistor R1 and receives one coarse reference voltage $V_R$, and the second terminal of the second resistor R2 is coupled to the first terminal of the first resistor R1. In one preferred embodiment, the reference voltage generating 22 in FIG. 2 has a plurality of reference voltage generating units of FIG. 6 arranged in a matrix.

Figure 7:
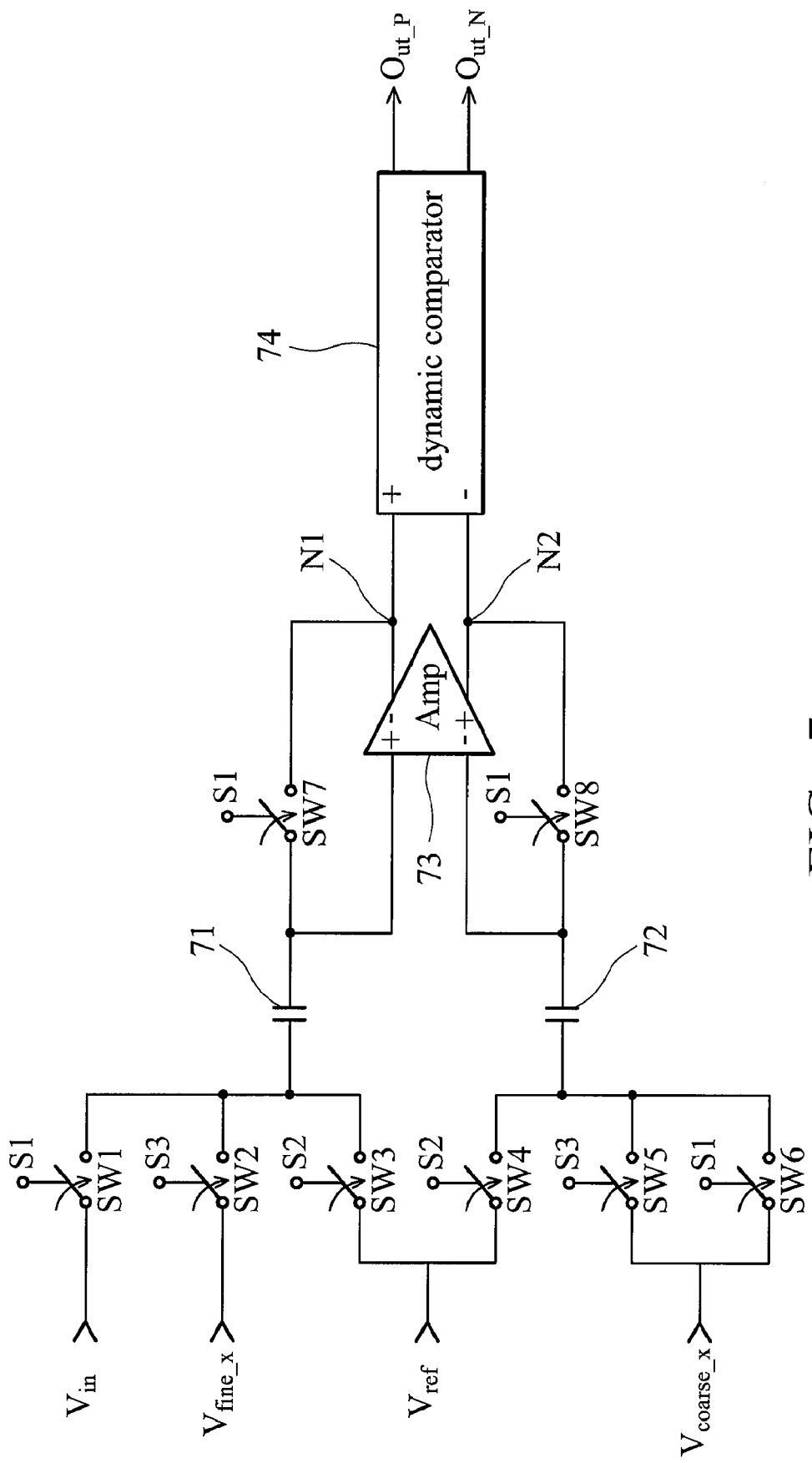
FIG. 7 is a schematic diagram of an embodiment of a comparator unit of the first coarse/fine comparator 22 or the second coarse/fine comparator 23 in FIG. 2.

FIG. 7 is a schematic diagram of an embodiment of a comparator unit of the first coarse/fine comparator 22 or the second coarse/fine comparator 23 in FIG. 2. A first switch SW1 controlled by a first turn-on signal has two terminals; one terminal receives the input voltage Vin and the other terminal is coupled to the first terminal of the first capacitor 71. A second switch SW2 controlled by a third turn-on signal has two terminals; one terminal receives a fine reference voltage $V_{fine\_x}$ and the other terminal is coupled to the first terminal of the first capacitor 71. A third switch SW3 controlled by a second turn-on signal has two terminals; one terminal receives a reference voltage $V_{ref}$ and the other terminal is coupled to the first terminal of the first capacitor 71. A fourth switch SW4 controlled by a second turn-on signal, having two terminals; one terminal receives a reference voltage $V_{ref}$ and the other terminal is coupled to a first terminal of a second capacitor 72. A fifth switch SW5 controlled by the third turn-on signal, having two terminals; one terminal receives a coarse reference voltage $V_{coarse\_x}$ and the other terminal is coupled to the first terminal of the second capacitor 72. A sixth switch SW6 controlled by the first turn-on signal has two terminals; one terminal receives the coarse reference voltage $V_{coarse\_x}$ and the other terminal is coupled to the first terminal of the second capacitor 72. A seventh switch controlled by the first turn-on signal, having two terminals; one terminal is coupled to the second terminal of the first capacitor 71 and a positive input terminal of a pre-amplifier 73, and the other terminal is coupled to a negative output terminal of the pre-amplifier 73. A eighth switch controlled by the first turn-on signal has two terminals; one terminal is coupled to the second terminal of the second capacitor 72 and a negative input terminal of the pre-amplifier 73, and the other terminal is coupled to a positive output terminal of the pre-amplifier 73. The dynamic comparator 74 has a positive input terminal coupled to the negative output terminal of the pre-amplifier 73, a negative input terminal coupled to the positive output terminal of the pre-amplifier 73, a positive output terminal and a negative output terminal.

The positive input terminal of the dynamic comparator 74 is further coupled to node N1 and the negative terminal of the dynamic comparator 74 is further coupled to node N2.

When the voltage of node N1 is greater than the voltage of node N2, the output signal Out_$_P$ of the dynamic comparator 74 is a logic high signal, and the output signal Out_$_N$ of the dynamic comparator 74 is a logic low signal. When the voltage of node N1 is less than the voltage of node N2, the output signal Out_$_P$ of the dynamic comparator 74 is a logic low signal, and the output signal Out_$_N$ of the dynamic comparator 74 is a logic high signal.

Figure 8:
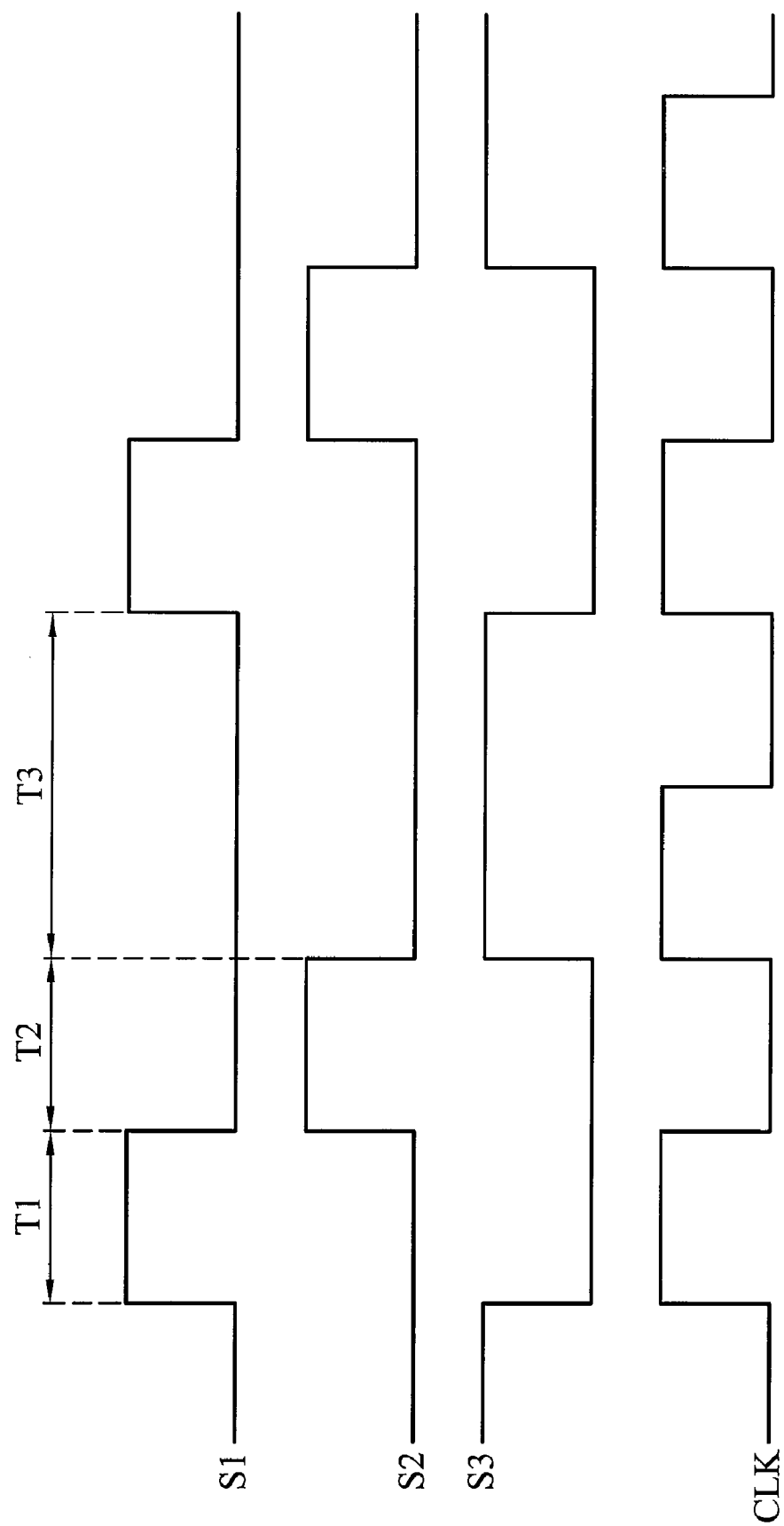
FIG. 8 is a timing diagram of the comparator unit in FIG. 7.

FIG. 8 is a timing diagram of the comparator unit in FIG. 7. At T1, the first turn-on signal S1 is high, thus, the first switch SW1, the sixth switch SW6, the seventh switch SW7 and the eighth switch SW8 are turned on. Because the first switch SW1 and the sixth switch SW6 are turned on, the first terminal of the first capacitor 71 receives the input voltage Vin, i.e. sampling the input voltage to store the input voltage in the first capacitor 71, and the first terminal of the second capacitor 72 receiving a coarse reference voltage $V_{coarse\_x}$, i.e. sampling the coarse reference voltage $V_{coarse\_x}$ to store voltage in the second capacitor 72. The pre-amplifier 73 processes an input offset storage procedure at T1 due to the turn-on of the seventh switch SW7 and the eighth switch SW8. Ideally, the voltage difference between the positive input terminal and negative input terminal of pre-amplifier 73 is 0. If the voltage of the positive input terminal and negative input terminal of pre-amplifier 73 is Vx at T1, the voltage of the second terminal of the first capacitor 71 is (Vx−Vin), and the voltage of the second terminal of the second capacitor 72 is (Vx−$V_{coarse\_x}$).

At T2, the second turn-on signal S2 is high, thus, the third switch SW3 and the fourth switch SW4 are turned on. The first terminals of both the first capacitor 71 and the second capacitor 73 receive the reference voltage $V_{ref}$, thus, the voltage of the positive input terminal of the pre-amplifier 73 changes from (Vx−Vin) to (Vx−Vin+$V_{ref}$), and the voltage of the negative input terminal of the pre-amplifier 73 changes from (Vx−$V_{coarse\_x}$) to (Vx−$V_{coarse\_x}$+$V_{ref}$), wherein $V_{ref}$ is a common voltage between the highest system voltage and lowest system voltage. In this embodiment, $$V_{ref} \text{ is } \frac{V_{RT} + V_{RB}}{2}.$$

The voltage difference between the nodes N1 and N2 is determined by the following equation:

((the voltage of the positive input terminal of the pre-amplifier 73)−(the voltage of the negative input terminal of the pre-amplifier 73))*$\alpha_{PREAMP}$, wherein $\alpha_{PREAMP}$ is a difference gain of the pre-amplifier 73. The dynamic comparator 74 changes the states of the Out_$_P$ and Out_$_N$ based on the voltage difference between nodes N1 and N2. According to the described operation, the coarse comparison finishes and it is determined that the input voltage Vin is between which two coarse reference voltages at T2.

At T3, the third turn-on signal S3 is high, thus, the second switch SW2 and the fifth switch SW5 are turned on. The first terminal of the first capacitor 71 receives a fine reference voltage $V_{fine\_x}$, and the first terminal of the second capacitor 72 receives a coarse reference voltage $V_{coarse\_x}$, thus, the positive input terminal of the pre-amplifier 73 changes from (Vx−Vin+$V_{ref}$) to (Vx−Vin+$V_{fine\_x}$), and the negative input terminal of the pre-amplifier 73 changes from (VX−

$V_{coarse\_x}+V_{ref}$) to ($Vx-V_{coarse\_x}+V_{coarse\_x}$). The voltage difference between the nodes N1 and N2 is determined by the following equation:

((the voltage of the positive input terminal of the pre-amplifier 73)–(the voltage of the negative input terminal of the pre-amplifier 73))*$\alpha_{PREAMP}$, wherein $\alpha_{PREAMP}$ is a difference gain of the pre-amplifier 73. The dynamic comparator 74 changes the states of the Out_$_P$ and Out_$_N$ based on the voltage difference between nodes N1 and N2. According to the described operation, the pre-amplifier compares the input voltage Vin with the fine reference voltage $V_{fine\_x}$ and outputs the comparison result through the dynamic comparator 74.

According to the description of FIG. 7, the issue that the sampled input voltage Vin in a coarse comparison is different from the sampled input voltage Vin in a fine comparison, caused by the different sampling time eliminates.

The pre-amplifier 73 and the dynamic comparator 74 operate by a voltage difference, thus, charge injection and the feedthrough due to the switching can be reduced. In a conventional single-ended amplifier, the comparison output is easily affected by the noise from the reference voltage, power and ground. In the comparator of FIG. 7, when the pre-amplifier 73 and the dynamic comparator 74 compare the input voltage Vin with the reference voltages, and the system reference voltage, system power and the system ground are affected by noise, the noise effect on the pre-amplifier 73 and the dynamic comparator 74 can be reduced because the noise can regard as a common signal and can be almost eliminated.

Figure 9:
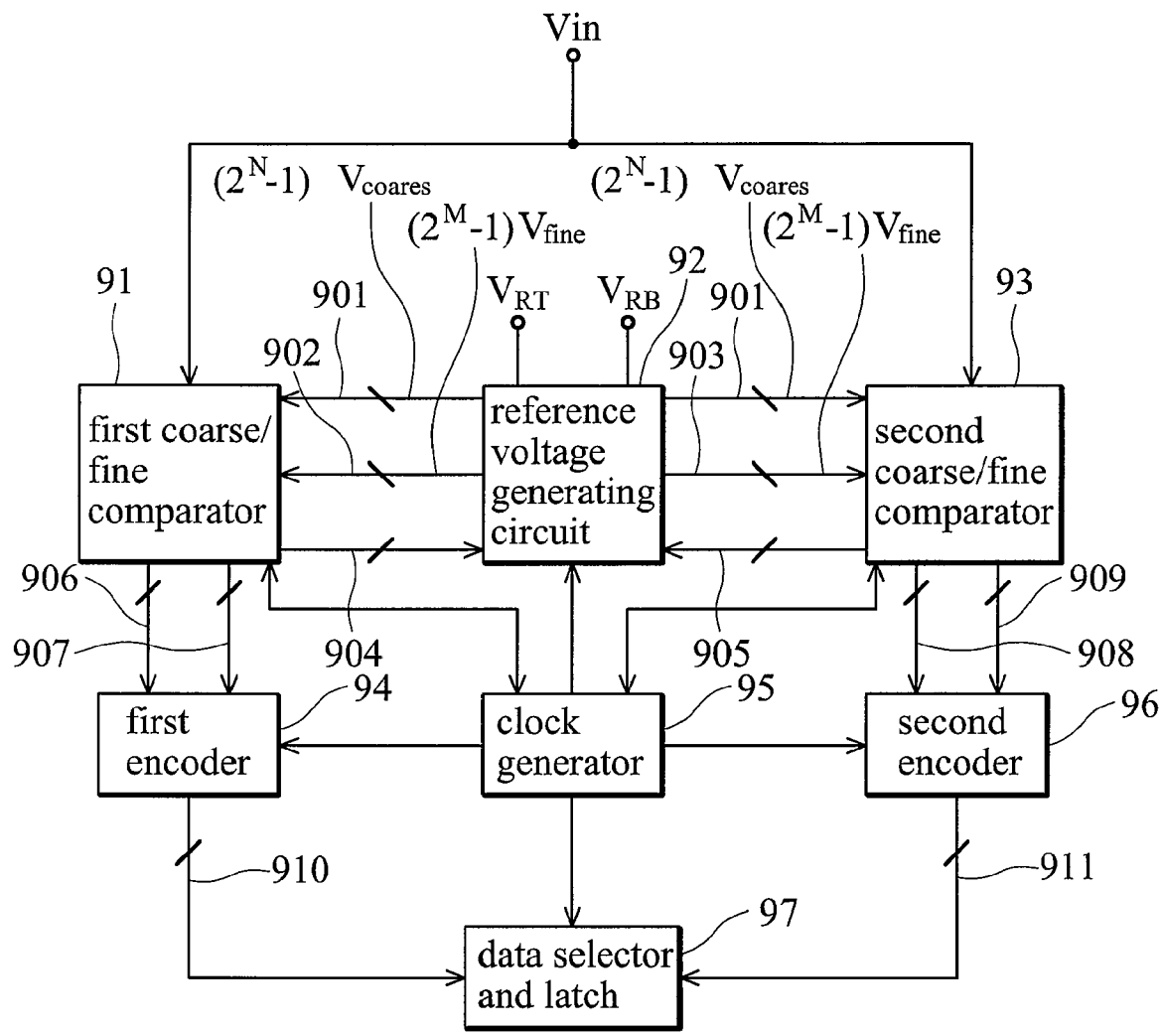
FIG. 9 is a block diagram of an embodiment of a (N+M)-bit analog-to-digital converter.

FIG. 9 is a block diagram of an embodiment of a (N+M)-bit analog-to-digital converter. A reference voltage generating circuit 92 coupled to a first coarse/fine comparator 91 and a second coarse/fine comparator 93 generates ($2^N-1$) coarse reference voltages and ($2^M-1$) fine reference voltages to the first coarse/fine comparator 91 and the second coarse/fine comparator 93 for comparing the input voltage Vin. A first encoder 94 coupled to the first coarse/fine comparator 91 transforms a first coarse thermometer code 906 and a first fine thermometer code 907 from the first coarse/fine comparator 91 to a digital code 910. A second encoder 96 coupled to the second coarse/fine comparator 93 transforms a second coarse thermometer code 908 and a second fine thermometer code 909 from the second coarse/fine comparator 93 to a digital code 911. A data selector and latch 97 receives and alternatively outputs the digital code 910 and 911. A clock generator 95 provides a clock signal to the elements of the analog-to-digital converter.

The reference voltage generating circuit 92 generates and transmits ($2^N-1$) coarse reference voltage $V_{COARSE}$ 901 to the first coarse/fine comparator 91 and the second coarse/fine comparator 93 based on the reference voltages $V_{RT}$ and $V_{RB}$. The first coarse/fine comparator 91 and the second coarse/fine comparator 93 determines that the input voltage Vin lies between which two coarse reference voltage and outputs $2^N$ control signals 904 and 905 to the reference voltage generating circuit 92. The reference voltage generating circuit 92 outputs the corresponding ($2^M-1$) fine reference voltages $V_{fine}$ 902 to the first coarse/fine comparator 91 and the corresponding ($2^M-1$) fine reference voltages $V_{fine}$ 903 to the second coarse/fine comparator 93 for comparison with the input voltage Vin.

After a coarse comparison, the first coarse/fine comparator 91 outputs a first coarse thermometer code 906 to a first encoder 94 to acquire an N-bit MSB data. After a fine comparison, the first coarse/fine comparator 91 outputs a first fine thermometer code 907 to a first encoder 94 to acquire an M-bit LSB data. The first encoder 94 combines the MSB data with the LSB data to acquire a (N+M)-bit data and transmits the (N+M)-bit data to the data selector and latch 97.

After a coarse comparison, the second coarse/fine comparator 93 outputs a second coarse thermometer code 908 to a second encoder 96 to acquire an N-bit MSB data. After a fine comparison, the second coarse/fine comparator 93 outputs a second fine thermometer code 909 to a second encoder 96 to acquire an M-bit LSB data. The second encoder 96 combines the MSB data with the LSB data to acquire a (N+M)-bit data and transmits the (N+M)-bit data to the data selector and latch 97.

In FIG. 9, the first coarse/fine comparator 91 and the second coarse/fine comparator 93 comprise a plurality of comparator units, such as shown in FIG. 7. When N is equal to M, the first coarse/fine comparator 91 and the second coarse/fine comparator 93 comprise at least ($2^N-1$, ) comparator units. When N is greater than M, the first coarse/fine comparator 91 and the second coarse/fine comparator 93 comprise at least ($2^N-1$) comparator units, and the comparator units required for fine comparison are less than ($2^N-1$), thus, the extra comparator units can be used for higher accuracy of analog-to-digital conversion.

For example, suppose N is 5, M is 4, and after the coarse comparison, the input voltage Vin is between $V_{coarse\_15}$ and $V_{coarse\_16}$. The reference voltage generating circuit 92 transmits 15 fine reference voltages 902($V_{fine\_1} \sim V_{fine\_15}$) to the coarse/fine comparator 91. Since the coarse/fine comparator 91 has 31 comparator units, thus, the coarse/fine comparator 91 can get 16 fine reference voltages, $V_{fine\_1} \sim V_{fine\_15}$, and $V_{coarse\_16}$, wherein 8 fine reference voltages $V_{fine\_9} \sim V_{fine\_15}$ and $V_{coarse\_15}$ are between $V_{coarse\_14}$ and $V_{coarse\_15}$ and 8 fine reference voltages $V_{fine\_1} \sim V_{fine\_7}$ and $V_{coarse\_16}$ are between $V_{coarse\_16}$ and $V_{coarse\_17}$, for further fine comparison. In other word, the voltage difference between the highest fine reference voltage and the lowest fine reference voltage is larger than the voltage difference of any two adjacent coarse reference voltages. Thus, the accuracy of analog-to-digital converter increases and the offset errors analog-to-digital converter decrease.

Figure 10:
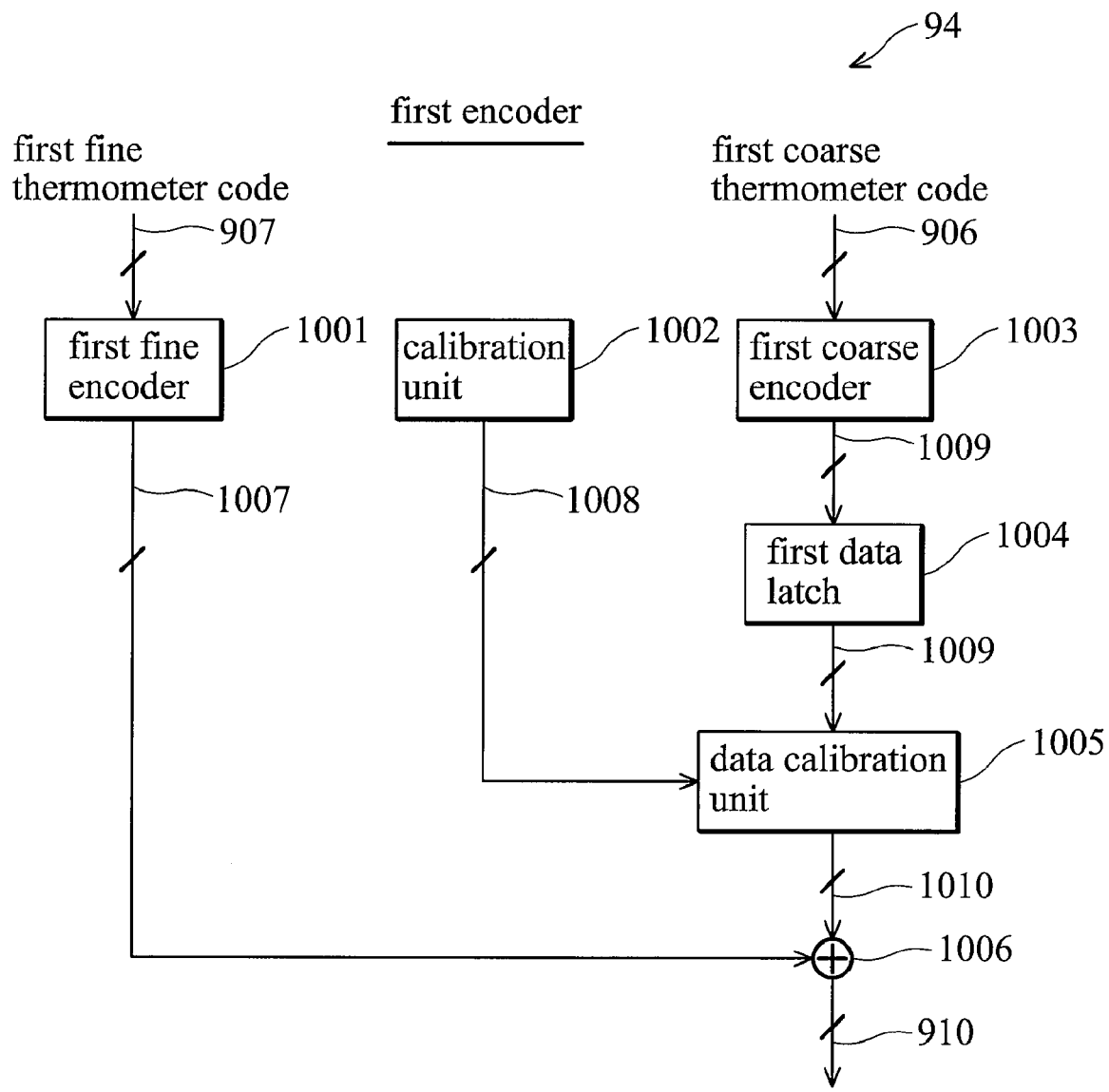
FIG. 10 is a block diagram of an embodiment of the first encoder in FIG. 9.

FIG. 10 is a block diagram of an embodiment of the first encoder in FIG. 9. The first encoder 94 comprises a first coarse encoder 1003, a first fine encoder 1001, a calibration unit 1002, a first data latch 1004, a data calibration unit 1005 and an adder 1006. The first coarse encoder 1003 receives and transforms the first coarse thermometer code 906 to an N-bit MSB data 1009.

After the coarse comparison, the MSB data 1009 is transmitted to the first data latch 1004 and after one clock cycle delay, the MSB data 1009 is transmitted to the data calibration unit 1005 from the first data latch 1004. The first fine encoder 1001 receives and transforms the first fine thermometer code 907 to an M-bit LSB data 1007. The calibration unit 1002 generates a calibration data 1008 based on the first fine thermometer code 907. The data calibration unit 1005 generates a first MSB data 1010 based on the MSB data 1009 and the calibration data 1008. The adder 1006 coupled to the data calibration unit 1005 and the first fine encoder 1001 outputs a digital code 910 based on the first MSB data 1010 and the first LSB data 1007.

Figure 11:
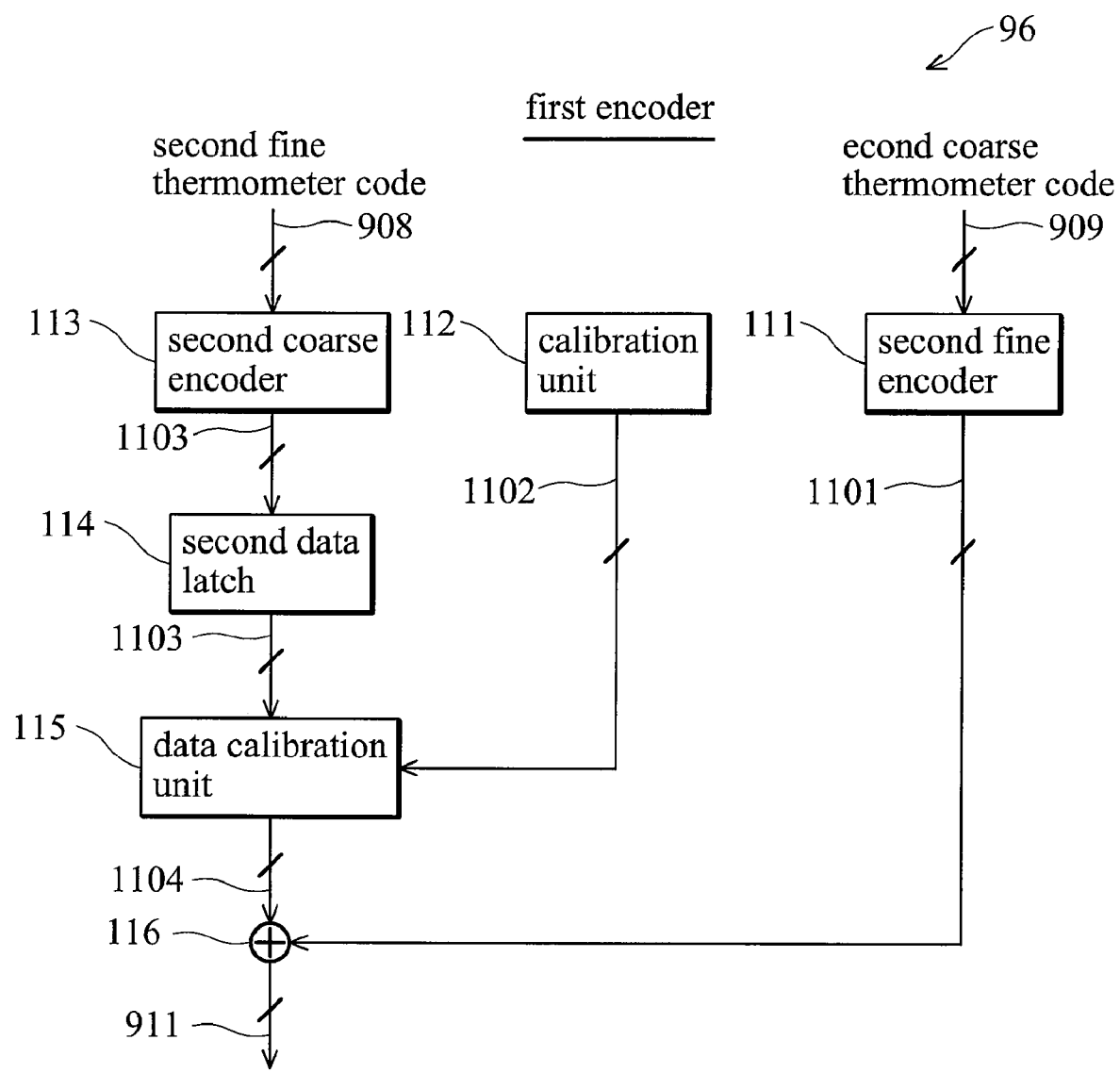
FIG. 11 is a block diagram of an embodiment of the second encoder in FIG. 9.

FIG. 11 is a block diagram of an embodiment of the second encoder in FIG. 9. The second encoder 96 comprises a second coarse encoder 113, a second fine encoder 111, a calibration unit 1 12, a second data latch 114, a data calibration unit 115 and an adder 116. The second coarse encoder 113 receives and transforms the second coarse thermometer code 908 to an N-bit MSB data 1 103. After the coarse comparison, the MSB data 1103 is transmitted to the second data latch 114 and after one clock cycle delay, the MSB data 1103 is transmitted to the data calibration unit 115 from the second data latch 114.

The second fine encoder 111 receives and transforms the second fine thermometer code 909 to an M-bit LSB data 1101. The calibration unit 112 generates a calibration data 1102 based on the second fine thermometer code 909. The data calibration unit 115 generates a second MSB data 1104 based on the MSB data 1103 and the calibration data 1102. The adder 116 coupled to the data calibration unit 115 and the second fine encoder 111 outputs a digital code 911 based on the second MSB data 1104 and the second LSB data 1101.

Figure 12:
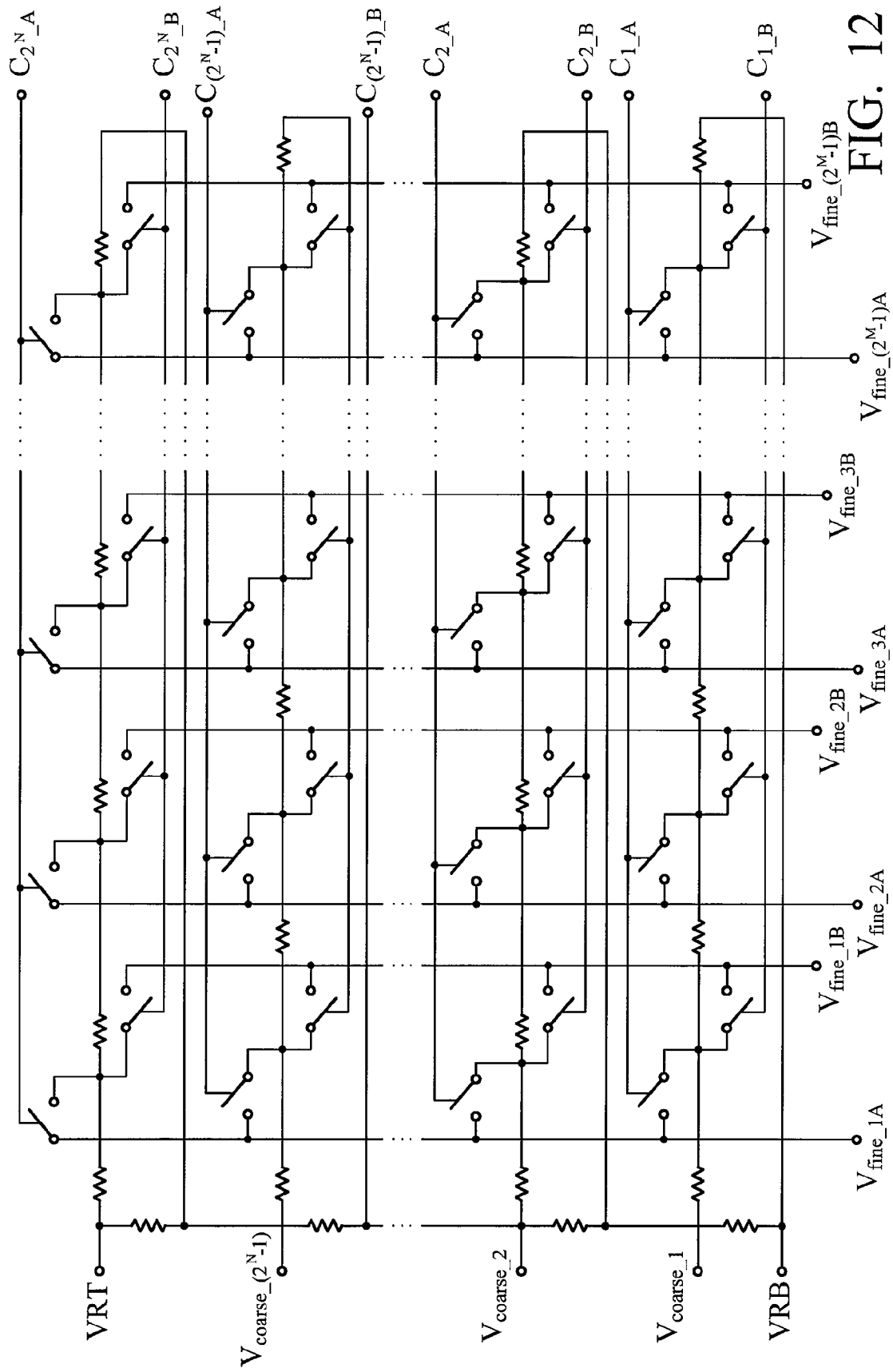
FIG. 12 is a circuit diagram of an embodiment of the reference voltage generating circuit in FIG. 9.

FIG. 12 is a circuit diagram of an embodiment of the reference voltage generating circuit in FIG. 9. In this embodiment, the reference voltage generating circuit 92 has $2^N \times 2^M$ reference voltage generating units, such as shown in FIG. 6. When the first coarse/fine comparator 91 determines which range between two of the coarse reference voltages the input voltage is at, the control signal $C_{X\_A}$ turns on the corresponding switch to acquire the fine reference voltages $V_{fine\_1A} \sim V_{fine\_(2^M-1)A}$. When the second coarse/fine comparator 93 determines which range between two of the coarse reference voltages the input voltage is at, the control signal $C_{X\_B}$ turns on the corresponding switch to acquire the fine reference voltages $V_{fine\_1B} \sim V_{fine\_(2^M-1)B}$.

According to the described operation, the first coarse/fine comparator 91 and the second coarse/fine comparator 93 have the same reference voltages. When N is greater than M, the analog-to-digital converter can request more fine reference voltages from the reference voltage generating circuit 92 for advanced fine comparison to increase the accuracy of the analog-to-digital converter. According to the reference voltage generating circuit 92 in FIG. 12, if the analog-to-digital converter requires P additional fine reference voltages, P switches are added in the reference voltage generating circuit 92 to output the corresponding P additional fine reference voltages to the first coarse/fine comparator 91 or the second coarse/fine comparator 93.

Figure 13:
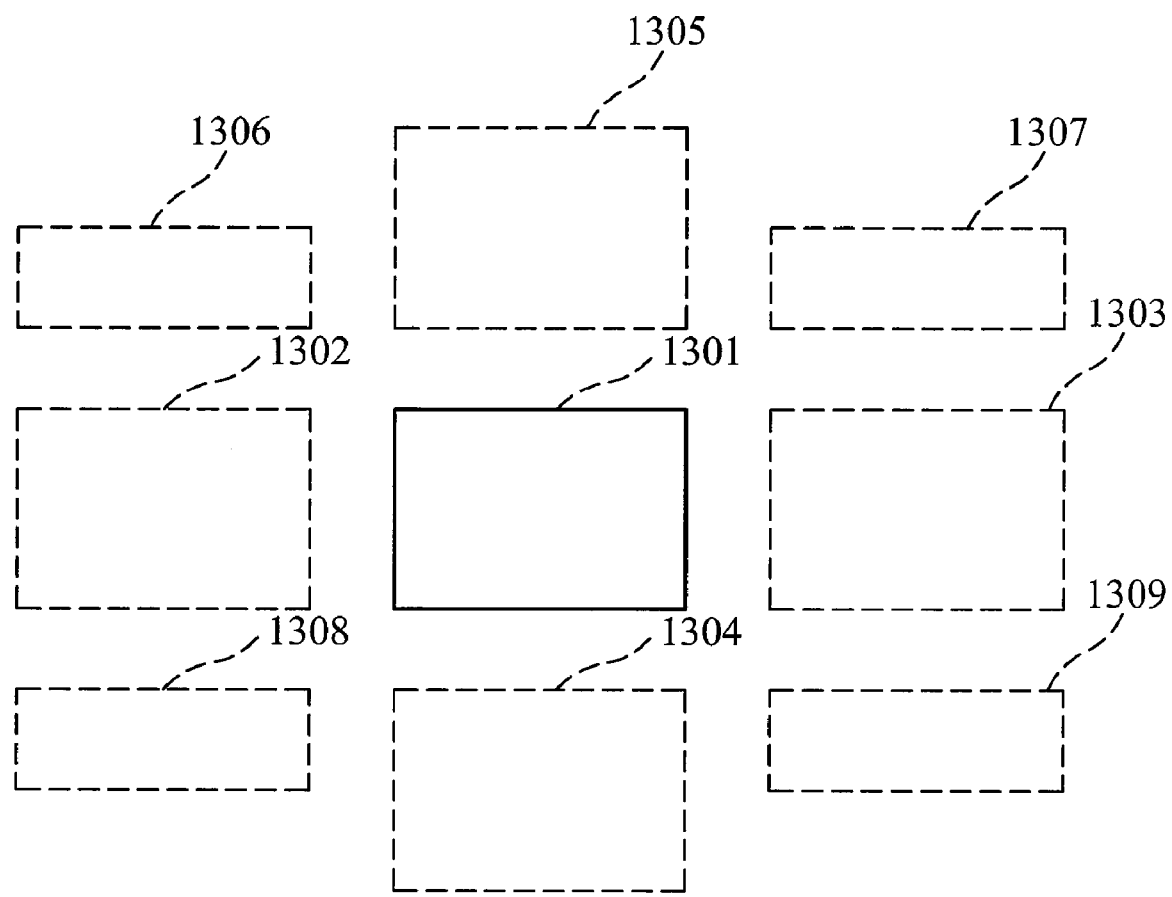
FIG. 13 is a layout diagram of an embodiment of the analog-to-digital converter.

Due to the symmetry of the first coarse/fine comparator and the second coarse/fine comparator, such as shown in FIG. 2 and FIG. 9, an optimal layout is provided. FIG. 13 is a layout diagram of an embodiment of the analog-to-digital converter. First, the reference voltage generating circuit is disposed in area 1301. The first coarse/fine comparator and the second coarse/fine comparator can be disposed in areas 1302 and 1303, or areas 1304 and 1305. In this embodiment, the first coarse/fine comparator and the second coarse/fine comparator are respectively disposed in areas 1302 and 1303. The first encoder and the second encoder are disposed in the same side of the areas 1302 and 1303. For example, the first encoder and the second are respectively disposed in areas 1308 and 1309, or areas 1306 and 1307. According to the described layout method, the layout area of the analog-to-digital converter is optimal.

Figure 14:
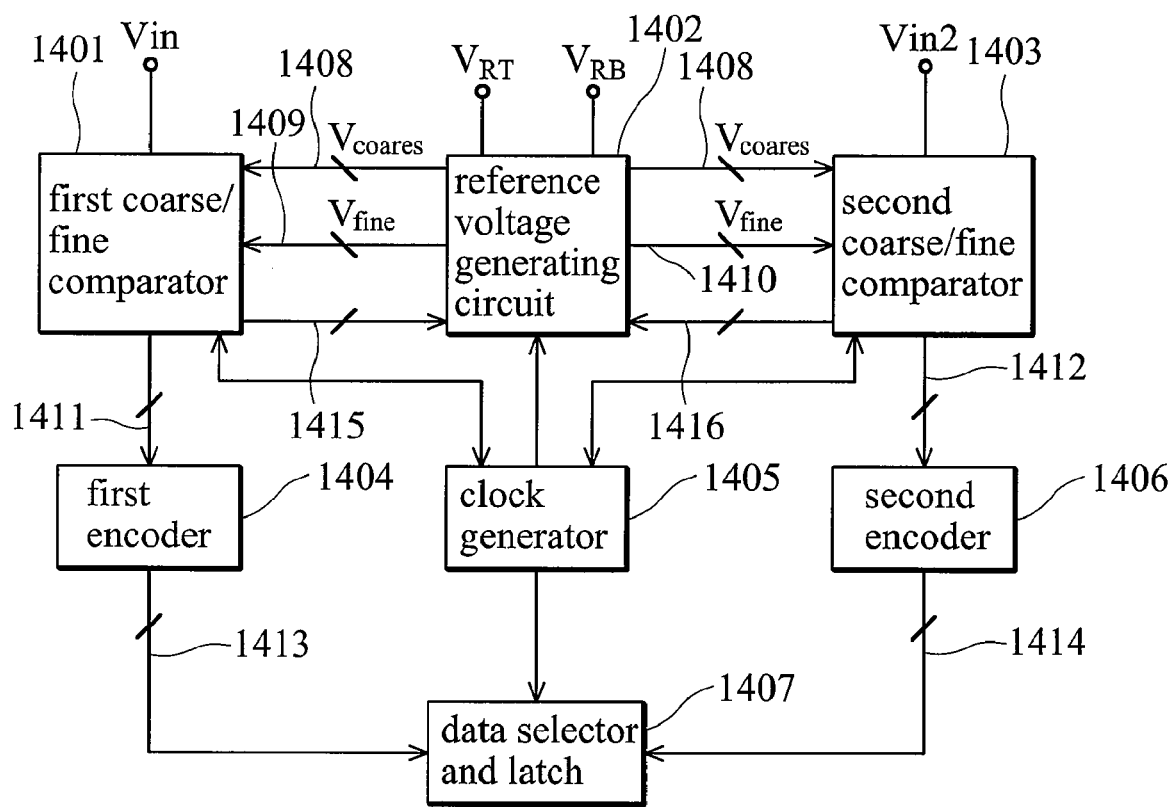
FIG. 14 is a block diagram of another embodiment of an analog-to-digital converter.

FIG. 14 is a block diagram of another embodiment of an analog-to-digital converter. A reference voltage generating circuit 1402 coupled to a first coarse/fine comparator 1401 and a second coarse/fine comparator 1403 generates reference voltages to the first coarse/fine comparator 1401 and the second coarse/fine comparator 1403 for comparing a first input voltage $V_{in1}$ and a second input voltage $V_{in2}$. A first encoder 1404 coupled to the first coarse/fine comparator 1401 transforms a thermometer code 1411 from the first coarse/fine comparator 1401 to a digital code 1413. A second encoder 1406 coupled to the second coarse/fine comparator 1403 transforms a thermometer code 1412 from the second coarse/fine comparator 1403 to a digital code 1414. A data selector and latch 1407 receives and alternatively outputs the digital code 1413 and 1414.

A clock generator 1405 provides a clock signal to the elements of the analog-to-digital converter. The reference voltage generating circuit 1402 generates and transmits a plurality of coarse reference voltage $V_{COARSE}$ 1408 to the first coarse/fine comparator 1401 and the second coarse/fine comparator 1403 based on the reference voltages $V_{RT}$ and $V_{RB}$. The first coarse/fine comparator 1401 and the second coarse/fine comparator 1403 determines that the first input voltage $V_{in1}$ and the second input voltage $V_{in2}$ lie between which two coarse reference voltage and outputs control signals 1415 and 1416 to the reference voltage generating circuit 1402. The reference voltage generating circuit 1402 outputs corresponding fine reference voltages $V_{FINE}$ 1409 or 1410 to the first coarse/fine comparator 1401 and the second coarse/fine comparator 1403 for comparison with the first input voltage $V_{in1}$ and the second input voltage $V_{in2}$. After comparison, the first coarse/fine comparator 1401 and the second coarse/fine comparator 1403 output a first thermometer code 1411 and a second thermometer code 1412 respectively to a first encoder 1404 and a second encoder 1406 to encode the thermometer code.

Figure 15:
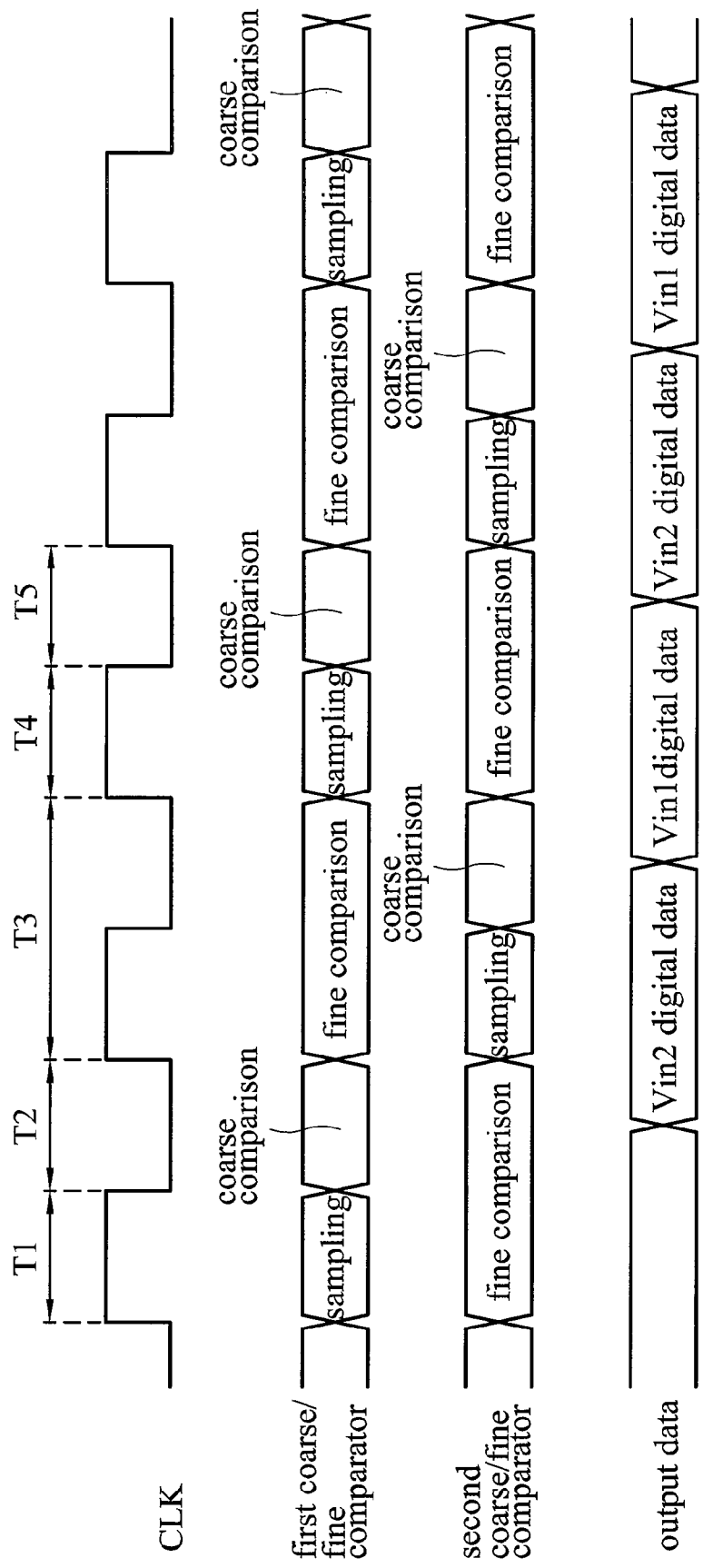
FIG. 15 is a timing diagram of the converter of FIG. 14.

To further illustrate the operation of the converter of FIG. 14, please refer to FIG. 15. FIG. 15 is a timing diagram of the converter of FIG. 14. At T1, the first coarse/fine comparator 1401 acquires a first voltage by sampling the first input voltage $V_{in1}$. At T2, the first coarse/fine comparator 1401 processes a coarse comparison on the first voltage. At T3, the first coarse/fine comparator 1401 processes a fine comparison on the first voltage.

When the clock signal is high in T3, the second coarse/fine comparator 1403 acquires a second voltage by sampling the second input voltage $V_{in2}$. When the clock signal is low in T3, the second coarse/fine comparator 1403 processes a coarse comparison on the second voltage. At T4 and T5, the second coarse/fine comparator 1403 processes a fine comparison on the second voltage.

After comparison of the first voltage, the first thermometer code 1411 is transmitted to the first encoder 1404 to encode. After comparison of the second voltage, the second thermometer code 1412 is transmitted to the second encoder 1406 to encode. The data selector and latch 1407 receives and alternatively outputs the digital code 1413 generated by the first encoder 1404 and 1414 generated by the second encoder 1406.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog to digital converter, comprising:
   a reference voltage generating circuit to generate a plurality of first reference voltages, and to generate a plurality of second of reference voltages based on a first control signal;
   a first bank of comparators receiving the first reference voltages and storing a first input signal, based on the first reference voltages and the first input signal to generate a first comparison code and a first control signal at a first period, and receiving the second reference voltages, based on the second reference voltages and the first input signal to generate a second comparison code at a second period;

a first bank of encoders receiving the first comparison code and the second comparison code to output a first digital code;

a second bank of comparators receiving the first reference voltages and storing a second input signal, based on the first reference voltages and the second input signal to generate a third comparison code and a second control signal at a second period, and receiving a plurality of third reference voltages, based on the third reference voltages and the second input signal to generate a fourth comparison code at a third period, wherein the reference voltage generating circuit generates the third reference voltages based on the second control signal; and a second encoder receiving the third comparison code and the fourth comparison code to output a second digital code.

2. The converter as claimed in claim 1, further comprising a clock generator to provide a reference clock signal for the reference voltage generating circuit and the first comparator to determine the first period and the second period.

3. The converter as claimed in claim 1, further comprising a data selector and latch unit receiving and alternatively outputting the first digital code and the second digital code.

4. The converter as claimed in claim 1, further comprising a clock generator to provide a reference clock signal for the reference voltage generating circuit, the first comparator and the second comparator to determine the first period, the second period and the third period.

5. The converter as claimed in claim 1, wherein the second bank of comparators comprises:

a plurality of voltage storage elements to store the voltage based on the second input signal, wherein each voltage storage element comprises a first voltage storage unit and a second voltage storage unit;

a plurality of amplifiers, wherein each of the amplifiers has a first input terminal coupled to one terminal of the corresponding first voltage storage unit and a second input terminal coupled to one terminal of the corresponding second voltage storage unit, and outputs at least one differential signal based on the voltage level of the first voltage storage unit and the second voltage storage unit; and a plurality of second comparators, wherein each of the second comparators is coupled to the corresponding amplifier, and outputs a comparison code based on the differential signal.

6. The converter as claimed in claim 5, wherein the first voltage storage unit receives the first input signal to store a first voltage at the first period, the second voltage storage unit receives the corresponding one of the first reference voltages to store a second voltage, the amplifier outputs a first differential signal based on the first voltage and the second voltage; the first voltage storage unit is further coupled to the voltage of the corresponding one of the second reference voltages at a second period, the second voltage storage unit is further coupled to the corresponding one of the first reference voltages at the second period, and herewith the amplifier outputs a second differential signal.

7. The converter as claimed in claim 6, wherein the reference voltage generating circuit generates the second reference voltage based on a comparison signal generated by the second comparator at the first period.

8. The converter as claimed in claim 5, wherein the amplifier has a first output terminal and a second output terminal respectively outputting the first differential signal and the second differential signal.

9. The converter as claimed in claim 8, wherein the terminals of the first voltage storage unit and the second voltage storage unit are respectively and optionally coupled to the first output terminal and the second output terminal and store the first voltage and the second voltage based on the error of the input voltage of the amplifier.

10. The converter as claimed in claim 5, wherein after the first voltage storage unit stores a first voltage and the second voltage storage unit stores a second voltage, the other terminal of the first voltage storage unit and the other terminal of the second voltage storage unit are coupled to a common reference voltage, and then the amplifier outputs the first differential signal based on the first voltage and the second voltage.

11. The converter as claimed in claim 1, wherein the first bank of comparators and the second bank of comparators have a plurality of comparators, and each comparator comprises:

a first capacitor having a first terminal and a second terminal;

a second capacitor having a first terminal and a second terminal;

a pre-amplifier having a positive input terminal, a negative input terminal, a positive output terminal, and a negative output terminal;

a first switch receiving the first input signal or the second input signal, wherein the first switch is controlled to make the first input signal or the second input signal to be coupled to the first terminal of the first capacitor by a first turn-on signal;

a second switch controlled to make the corresponding one of the second reference voltages to be coupled to the first terminal of the first capacitor by a third turn-on signal;

a third switch controlled to make a common reference voltage and the other terminal to be coupled to the first terminal of the first capacitor by a second turn-on signal;

a fourth switch controlled to make the common reference voltage to be coupled to the first terminal of the second capacitor by a second turn-on signal;

a fifth switch controlled to make the corresponding one of the first reference voltages to be coupled to the first terminal of the second capacitor by the third turn-on signal;

a sixth switch controlled to make the corresponding one of the first reference voltages to be coupled to the first terminal of the second capacitor by the first turn-on signal;

a seventh switch either coupled to the second terminal of the first capacitor or the positive input terminal of the pre-amplifier, wherein the seventh switch is controlled to make the second terminal of the first capacitor or the positive input terminal of the pre-amplifier to be coupled to the negative output terminal of the pre-amplifier by the first turn-on signal;

a eighth switch either coupled to the second terminal of the second capacitor or the negative input terminal of the pre-amplifier, wherein the eighth switch is controlled to make the second terminal of the second capacitor or the negative input terminal of the pre-amplifier to be coupled to the postive output terminal of the pre-amplifier by the first turn-on signal; and a dynamic comparator having a positive input terminal coupled to the negative output terminal of the pre-amplifier, a negative input terminal coupled to the positive output terminal of the pre-amplifier, a positive output terminal and a negative output terminal.

12. The converter as claimed in claim 1, wherein the first bank of comparators comprises:
   a plurality of voltage storage elements, wherein each of the voltage storage elements comprises a first voltage storage unit and a second voltage storage unit, and the stored voltage of the voltage storage element is based on the first input signal;
   a plurality of amplifiers, wherein each of the amplifiers has a first input terminal coupled to one terminal of the corresponding one of the first voltage storage units and a second input terminal coupled to one terminal of the corresponding one of the second voltage storage units, and the amplifier outputs at least one differential signal based on the stored voltage of the first voltage storage unit and the second voltage storage unit; and
   a plurality of first comparators, wherein each of the first comparators is coupled to the corresponding one of the amplifiers and outputs a comparison code based on the differential signal.

13. The converter as claimed in claim 12, wherein the first voltage storage unit receives the first input signal and stores a first voltage at the first period, the second voltage storage units receives the corresponding one of the first reference voltages and stores a second voltage, the amplifier outputs a first differential signal based on the first voltage and the second voltage; the first voltage storage unit is further coupled to the corresponding one of the second reference voltages at a second period, the second voltage storage unit is further coupled to the corresponding one of the first reference voltages at the second period, and herewith the amplifier outputs a second differential signal.

14. The converter as claimed in claim 12, wherein the reference voltage generating circuit generates the second reference voltage based on the comparison code generated by the first comparators at the first period.

15. The converter as claimed in claim 12, wherein the amplifier has a first output terminal and a second output terminal respectively outputting the first differential signal and the second differential signal.

16. The converter as claimed in claim 15, wherein the terminals of the first voltage storage unit and the second voltage storage unit are optionally coupled to the first output terminal and the second output terminal to store the first voltage and the second voltage based on the error of the input voltage of the amplifier.

17. The converter as claimed in claim 12, wherein after the first voltage storage unit stores a first voltage and the second voltage storage unit stores a second voltage, and the other terminal of the first voltage storage unit and the other terminal of the second voltage storage unit are coupled to a common reference voltage, and then the amplifier outputs the first differential signal based on the first voltage and the second voltage.

18. The converter as claimed in claim 1, wherein the first bank of encoders comprises:
   a first coarse encoder receiving the first comparison code to generate a high bit;
   a first fine encoder receiving the second comparison code to generate a low bit;
   a first latch temporarily storing the first high bit for synchronizing the first high bit and the first low bit; and
   an adder coupled to the first latch and the first fine encoder, outputting a first digital data based on the first high bit and the first low bit.

19. The converter as claimed in claim 1, wherein the difference of the highest voltage and the lowest voltage among the second reference voltages is larger than the interval of any two adjacent voltages of the first reference voltages.

20. A comparator, comprising:
   a voltage storage element having a first voltage storage unit and a second voltage storage unit to store voltage, wherein the stored voltage of the voltage storage element is determined based on the voltage of the input signal of the voltage storage element;
   an amplifier having a first input terminal coupled to one terminal of the first voltage storage unit and a second input terminal coupled to one terminal of the second voltage storage unit to output at least one differential signal based on the stored voltages of the first voltage storage unit and the second voltage storage unit; and
   a comparison element coupled to the amplifier to output a comparison signal based on the differential signal, wherein
   at the first period, the first voltage storage unit receives an input signal and stores a first voltage, the second voltage storage units receives a first reference voltage and stores a second voltage, the amplifier outputs a first differential signal based on the first voltage and the second voltage; at the second period, the first voltage storage unit is further coupled to a second reference voltage, the second voltage storage unit is further coupled to the first reference voltage, and herewith the amplifier outputs a second differential signal based on the stored voltages of the first voltage storage unit and the second voltage storage unit.

21. The comparator as claimed in claim 20, wherein the first reference voltage and the second reference voltage are provided by a reference voltage generating circuit.

22. The comparator as claimed in claim 21, wherein the reference voltage generating circuit generates the second reference voltage based on the comparison signal generated by the comparison element at the first period.

23. The comparator as claimed in claim 20, wherein the amplifier has a first output terminal and a second output terminal respectively outputting a first differential signal and a second differential signal.

24. The comparator as claimed in claim 23, wherein the other terminal of the first voltage storage unit and the other terminal of the second voltage storage unit are respectively store the first voltage and the second voltage based on the error of the input voltage of the amplifier.

25. The comparator as claimed in claim 20, wherein after the first voltage storage unit stores the first voltage and the second voltage storage units stores the second voltage, the first terminal of the first voltage storage unit and the first terminal of the second voltage storage unit are coupled to a common reference voltage, and then the amplifier outputs the first differential signal based on the first voltage and the second voltage.

26. A layout method for an analog to digital converter, comprising:
   providing a substrate;
   disposing a reference voltage generating circuit on the substrate;
   disposing a first bank of comparators on a first side of the reference voltage generating circuit, and a second bank of comparators on a second side, wherein the second side is the opposite side of the first side; and disposing a first bank of encoders on the same side of the first coarse/fine comparator and a second bank of encoders on the same side of the second coarse/fine comparator.

27. The method as claimed in claim 26, wherein the relative position between the first bank of comparators and the first bank of encoders is the same as the relative position between the second bank of comparators and the second bank of encoders.

28. An analog to digital converter, comprising:
   a reference voltage generating circuit to generate a first reference voltage;
   a first bank of comparators receiving and comparing an input voltage and the first reference voltage to output a first control signal and a first code, wherein the reference voltage generating circuit outputs a second reference voltage in response to the first control signal, and the first bank of comparators compare the input voltage and the second reference voltage to output a second code; and
   a second bank of comparators receiving and comparing the input voltage and the first reference voltage to output a second control signal and a third code, wherein the reference voltage generating circuit outputs a third reference voltage in response to the second control signal, and the second bank of comparators compare the input voltage and the third reference voltage to output a fourth code.

29. The converter as claimed in claim 28, further comprising:
   a first bank of encoders receiving the first code and the second code to output a first digital code;
   a second bank of encoders receiving the third code and the fourth code to output a second digital code; and
   a data selector and latch unit receiving the first digital code and the second digital code and alternatively outputting the first digital code and the second digital code.

30. An analog to digital converter, comprising:
   a reference voltage generating circuit to generate a first reference voltage;
   a first bank of comparators receiving and comparing a first input voltage and the first reference voltage to output a first control signal and a first code, wherein the reference voltage generating circuit outputs a second reference voltage in response to the first control signal, and the first comparator compare the first input voltage and the second reference voltage to output a second code; and
   a second bank of comparators receiving and comparing a second input voltage and the first reference voltage to output a second control signal and a third code, wherein the reference voltage generating circuit outputs a third reference voltage in response to the second control signal and the second bank of comparators compare the second input voltage and the third reference voltage to output a fourth code.

31. The converter as claimed in claim 30, further comprising:
   a first bank of encoders receiving the first code and the second code to output a first digital code;
   a second bank of encoders receiving the third code and the fourth code to output a second digital code; and
   a data selector and latch unit receiving the first digital code and the second digital code and alternatively outputting the first digital code and the second digital code.

* * * * *